United States Patent
Maschke

(10) Patent No.: US 7,580,738 B2
(45) Date of Patent: Aug. 25, 2009

(54) SYSTEM PROVIDING VISUALIZATION OF MAGNETIC FIELD INTENSITY VARIATION

(75) Inventor: Michael Maschke, Lonnerstadt (DE)

(73) Assignee: Siemens Aktiengesellschaft, Munich (DE)

( * ) Notice: Subject to any disclaimer, the term of this patent is extended or adjusted under 35 U.S.C. 154(b) by 824 days.

(21) Appl. No.: 11/101,621

(22) Filed: Apr. 7, 2005

(65) Prior Publication Data
US 2005/0228258 A1   Oct. 13, 2005

(30) Foreign Application Priority Data
Apr. 7, 2004   (DE)   .................. 10 2004 017 183

(51) Int. Cl.
*A61B 5/05*   (2006.01)
(52) U.S. Cl. ........................ 600/410; 600/407
(58) Field of Classification Search ............... 600/407; 362/276; 340/286.13, 286.14
See application file for complete search history.

(56) References Cited

U.S. PATENT DOCUMENTS

| | | | | |
|---|---|---|---|---|
| 4,056,805 A | * | 11/1977 | Brady | 84/464 R |
| 4,734,575 A | * | 3/1988 | Wagli et al. | 250/221 |
| 4,990,850 A | * | 2/1991 | Votruba | 324/225 |
| 5,355,885 A | * | 10/1994 | Tsuda et al. | 600/418 |
| 6,202,360 B1 | * | 3/2001 | Rattner et al. | 52/36.4 |
| 6,330,467 B1 | | 12/2001 | Creighton, IV et al. | |
| 6,707,455 B2 | * | 3/2004 | van Oort et al. | 345/440 |
| 2005/0128751 A1 | * | 6/2005 | Roberge et al. | 362/276 |
| 2005/0228255 A1 | * | 10/2005 | Saracen et al. | 600/407 |

FOREIGN PATENT DOCUMENTS

DE   196 25 409 A1   1/1998
DE   102 03 372 A1   9/2003

OTHER PUBLICATIONS

GUV-R B11: GUV-Regel "Elektromagnetische Felder", Ausgabe, Jul. 2002, pp. 31-33. http://regelwerk.unfallkassen.de/daten/regeln/R_B11.pdf.

* cited by examiner

*Primary Examiner*—Eric F Winakur
*Assistant Examiner*—Helene Bor

(57) ABSTRACT

To increase safety in the event of access to a total system 1, in particular a medical system, with a field of high magnetic field intensity 3.1, an optical signal is provided in the form of a luminescent display field 24 graphically reproducing the field of high magnetic field intensity 3.1; according to one embodiment of the invention a representation of the luminescent display field 24 is provided by means of photodiodes 31 arranged on the floor and reproducing the field line pattern and/or the different field intensities by means of corresponding different colors.

13 Claims, 2 Drawing Sheets

SYSTEM PROVIDING VISUALIZATION OF MAGNETIC FIELD INTENSITY VARIATION

CROSS REFERENCE TO RELATED APPLICATIONS

This application claims priority to the German application No. 10 2004 017 183.1, filed Apr. 7, 2004 which is incorporated by reference herein in its entirety.

FIELD OF INVENTION

The invention relates to a total system, in particular a medical system with a field of high, variable magnetic field intensity.

BACKGROUND OF INVENTION

In medical technology, systems based on nuclear spin resonance are used for image generation, like for example magnetic resonance systems (MR) or devices for the magnetic navigation (MN) of probes within the body. System of this type known for example from the previously mentioned DE 102 03 372 A1 require magnetic fields, some of a variable nature, with extremely high field intensities of up to 0.1 Tesla for MN systems and 3 Tesla for MR systems.

SUMMARY OF INVENTION

Strong magnetic fields can result in unwanted damage and disturbance to electronic devices, including medical devices as well as clocks and magnetic cards.

There are also known cases in which patients in an area of high field intensity for examination purposes are injured or killed by metal objects accelerating towards them. Personal injury can also result when people with metal implants are located in the area of the fields of high magnetic field intensity. An injury to the myocardium can occur particularly in patients with pacemakers due to the pacemaker electrodes heating up as a result of induction or the heart pacemaker can fail as a result of faults at the pulse generator.

To reduce this risk, or prevent it completely, warning signs have hitherto been used in the access area of the systems mentioned based on nuclear spin resonance and the critical area of the field lines has been marked on the floor of the examination room using colored adhesive tape. Notification of this type is nevertheless frequently overlooked or unintentionally disregarded. Furthermore, medical personal also often forget to look out for implants, or incorrect information is given unwittingly on the part of the patient.

GUV-Rule B11, Electromagnetic fields, issue July 2002, §14, pages 31 to 33, discloses inter alia the use of conspicuous colors on the walls and markings on the floor as additional warning and notification signs, in order to prevent danger in systems with powerful static magnetic fields.

It is therefore an object of the invention to increase safety in a simple manner in the event of access to fields of high, variable magnetic field intensity.

The object of this invention is achieved by the claims Advantageous embodiments of the invention are set down in the dependent claims.

The subsystem provided in accordance with the invention for the optical representation of the field of high, variable magnetic field intensity with a means for generating an optical signal in the form of a correspondingly controllable luminescent display field, which reproduces the magnetic field graphically, offers the advantage of a particularly conspicuous signal which can not be overlooked even in hectic situations. In addition, notification is not only given in respect of danger, but the precise position of the danger area is also clearly indicated. Users, patients and/or approaching persons are sensitized in order, if necessary, to take further steps to avoid damage.

In one embodiment a luminescent display field located on the floor, in particular embedded in the floor, is provided, whereby on the one hand a clear warning is guaranteed and on the other hand accessibility to the room is essentially provided for people and movable components of the total system. A luminescent display field displaying the field line pattern and/or the field intensity of the field of high, variable magnetic field intensity is advantageously provided for an optimized recognizability.

BRIEF DESCRIPTION OF THE DRAWINGS

The invention and further advantageous embodiments according to features of the dependent claims are described in more detail with reference to the schematically represented exemplary embodiments in the drawing, in which:

DETAILED DESCRIPTION OF INVENTION

Figure 1:
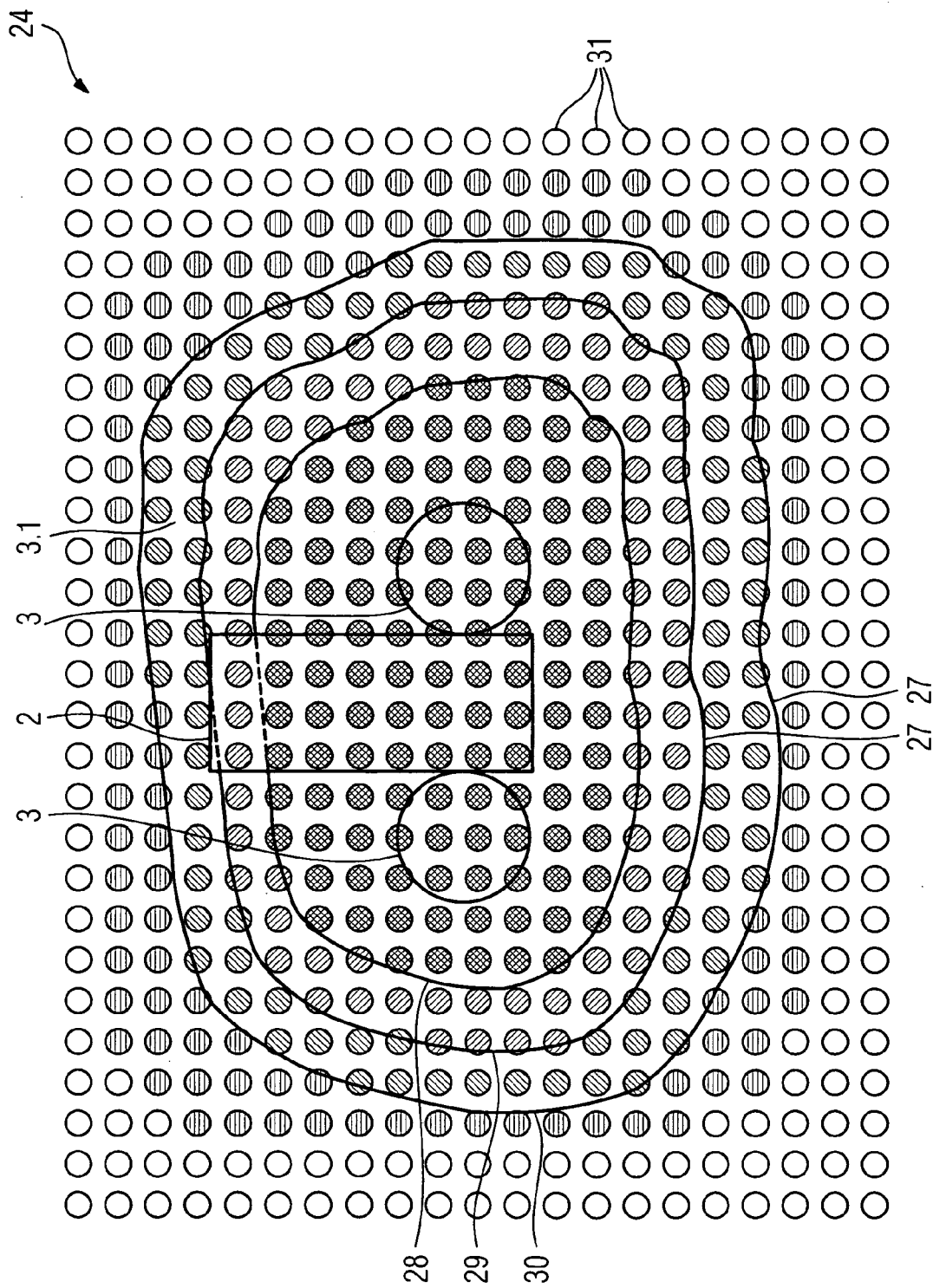
FIG. 1 shows an optical display of danger areas in the form of a luminescent display field made of light-emitting diodes which reproduce the field of high, variable magnetic field intensity on the floor.

FIG. 1 shows a section from a total system, in particular a medical system with device 3 generating a magnetic field, which generates a field of high, variable magnetic field intensity 3.1. A patient support 2 for examining and/or treating a patient is located at least partially in the area of the field of high magnetic field intensity 3.1. In one embodiment of the invention a luminescent display field 24 displaying the field line pattern 27 and/or the field intensity of the field of high, variable magnetic field intensity 3.1 is provided. It is located in the floor of an examination room (not shown). For reasons of clarity in FIG. 1, the luminescent display field 24 is shown such that it is completely visible despite the patient support 2 blocking the direct visual field and the device 3 generating the magnetic field. The luminescent display field 24 can similarly be provided on the ceiling or on the walls. The representation of the luminescent display field 24 by means of light-emitting diodes 31 is advantageous due to the long service life and the low energy consumption of the light-emitting diodes.

The luminescent display field 24 can also be represented by means of bulbs or another illumination means. For particularly simple recognition, one embodiment of the invention provides for a representation of different field intensities by means of correspondingly different markings, in particular different colors, of the luminescent display field 24. FIG. 1 shows different colors by means of different hatchings. In this way, the area within a first field line 28 of 1 mT can be shown in red, the area between the first and within a second field line 29 of 0.8 mT in orange, the area between the second and within a third field line 30 of 0.5 mT in yellow and the area of the magnetic field of an intensity below 0.5 mT in green.

Figure 2:
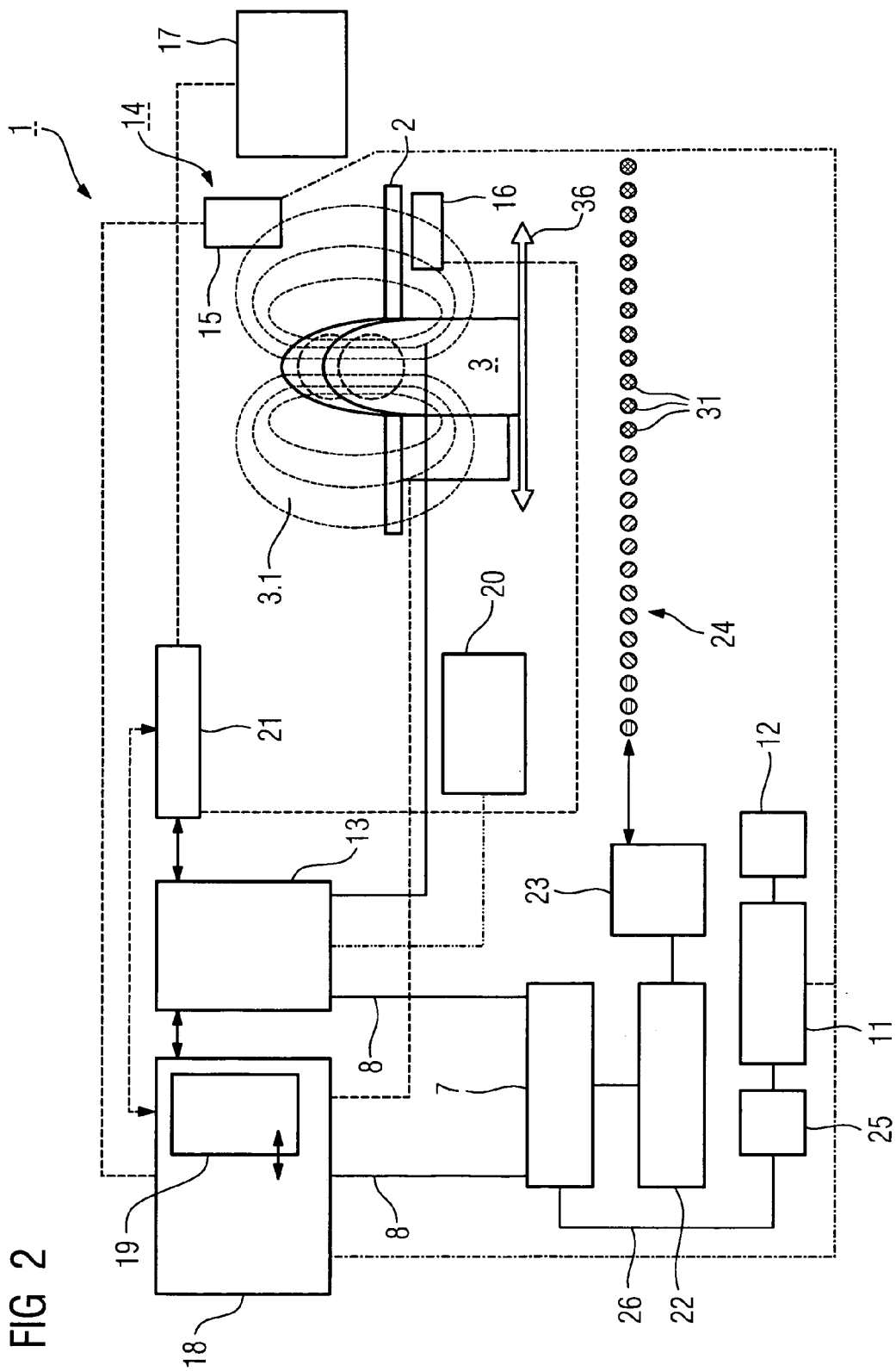
FIG. 2 shows a medical system for magnetic navigation with an associated magnetic field of high, variable field intensity, a subsystem for detecting access and an optical display of danger areas according to FIG. 1.

FIG. 2 shows integration of the luminescent display field 24 in a total medical system 1. The total system 1 described here is a device for magnetic navigation, the essential components of which are a control device 13 for the magnetic navigation system and an X-ray image recording system 14, in addition to the device 3 generating a magnetic field.

The device 3 generating a magnetic field can be arranged in a movable fashion, for example on runners 36. It establishes an external field of high, variable magnetic field intensity 3.1 in relation to the patient, with which a permanent or variable magnetic field of an object (not shown in further detail), a catheter for example, interacts within the body of the patient. By changing one or both magnetic fields or by changing the position of the magnetic fields, the object in the body of the patient can be controlled by means of the control device 13 for the magnetic navigation system. A system of this type is essentially known for example from U.S. Pat. No. 6,630,879 B1.

The X-ray image recording system 14 serves to monitor the movements of the object in the body of the patient. The X-ray image recording system 14 comprises a radiation source 15 for generating X-rays, an X-ray image detector 16 for recording the X-ray images, a control device for the X-ray system 18 and an X-ray generator 19. The radiation source 15 and the X-ray image detector 16 can be arranged in a movable C-arm construction (not shown here), described for example in DE 196 25 409 A1.

The image signals recorded by the X-ray image detector 16 and routed to the control device 18 for the X-ray system are processed in a digital image processing device 21 and can be output by means of a display 17. The control device 13 for the magnetic navigation and the control unit 18 for the X-ray image recording system can communicate alternately with one another and with the image processing device 21, in order to avoid collisions of the system components for example. A similar total system 1 is known from DE 102 03 372 A1.

According to one embodiment of the invention, a representation of the field of high, variable magnetic field intensity 3.1 is provided as a function of detection of access to the area of the field 3.1. Integrated in the subsystem are a means for detecting the access 25, in particular a door contact and/or a light barrier or/and a metal detector and an evaluation unit for access monitoring 7, communication lines 8; 26 from the evaluation unit 7 to the control devices 18; 13 and to the means for detecting access 25, a computing unit 22, a control unit 23 for the luminescent display field 24, a voice output module 11 and a loudspeaker 12. The total system 1 and the subsystem 7; 8; 11; 12; 22-26; 31 can be arranged in a room (not described in further detail). In addition to the above mentioned means for detecting access, an ultrasound room monitoring system or pressure sensors are also conceivable. The access detection system can also be arranged in the floor together with the light-emitting diodes and can determine the position of the person entering.

A connection between the means for detecting access 25 and an evaluation unit 7 is provided by means of a communication line 26. In addition, the evaluation unit 7 is connected to the control units 18 of the X-ray image recording system and 13 the magnetic navigation by means of communication lines 8, such that a data exchange is possible. A control unit 23 is provided for controlling the light-emitting diodes 31, which is connected to the evaluation unit 7 via a computing unit 22. During the operation of the total system, position data and field intensity data of the field of high, variable magnetic field intensity 3.1 of the total system 1 and the elements 15; 16; 3, arranged in a movable fashion, of the X-ray image recording system and the magnetic navigation are transmitted to the evaluation unit 7, forwarded to the computing unit 22 and compared there with data which is stored in a storage unit (not shown). The evaluation results can be transmitted to the control unit 23 and can be used for controlling the luminescent display field 24 made of light-emitting diodes. The voice message containing a warning relating to the magnetic field can be provided via the voice output module 11 and the loudspeaker 12.

The invention can be summarized as follows: to increase safety during access to a total system 1, in particular a medical system with a field of high, variable magnetic field intensity 3.1, an optical signal is provided in the form of a correspondingly controllable luminescent display field 24, which graphically represents the field of high magnetic field intensity 3.1. According to one embodiment of the invention a representation of the luminescent display field 24 is provided by means of light-emitting diodes 31 located on the floor and reproducing the field line pattern and/or the different field intensities by means of corresponding different colors.

The invention claimed is:

1. A safety system positioned along the floor of a room when in use in which a medical system is operated, the medical system including a device for generating a high intensity magnetic field which exhibits a spatially variable magnetic field intensity about the room, the safety system comprising:
a luminescent display array including a plurality of light sources positioned at known locations on the floor;
a control unit coupled to control the display array wherein each light source is controlled to be indicative of the spatially variable magnetic field intensity of its respective known location;
a device configured to detect access to an area of the room in which the magnetic field is present;
an evaluation unit coupled to the device to monitor access detection; and
a computing unit coupled to receive signals from the evaluation unit and provide control signals to the control unit based on signals received from the evaluation unit to increase safety in the room under high magnetic field conditions.

2. The system according to claim 1, wherein the device configured to detect access provides detection based on operation of a door contact, a light barrier mechanism or a metal detector.

3. The system according to claim 1, wherein the luminescent display array is arranged on a floor.

4. The system according to claim 3, wherein the luminescent display array is embedded in the floor.

5. The system according to claim 1, wherein variation in magnetic field intensity about the room is indicated by a current field line pattern of the magnetic field.

6. The system according to claim 1, wherein variation in magnetic field intensity about the room is indicated by a current field intensity of the magnetic field.

7. The system according to claim 6, wherein the current field intensity is represented by different markings corresponding to different field intensities.

8. The system according to claim 7, wherein the markings include different colors.

9. The system according to claim 1, wherein light sources in the luminescent display array light bulbs.

10. The system according to claim 1, wherein light sources in the luminescent display array are light emitting diodes.

11. The system according claim 1, wherein the luminescent display array is controlled by current data related to the magnetic field.

12. The system according claim 11, wherein the current data include a magnetic field intensity of the magnetic field.

13. The system according to claim 11, wherein the current data include position data of the magnetic field.

* * * * *